US012671376B2

(12) United States Patent
Yamauchi et al.

(10) Patent No.: US 12,671,376 B2
(45) Date of Patent: Jun. 30, 2026

(54) AMPLIFIER CIRCUIT AND SYSTEM

(71) Applicants: Kabushiki Kaisha Toshiba, Tokyo (JP); Toshiba Electronic Devices & Storage Corporation, Tokyo (JP)

(72) Inventors: Akira Yamauchi, Yokohama Kanagawa (JP); Hiroshi Yoshino, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 410 days.

(21) Appl. No.: 18/243,597

(22) Filed: Sep. 7, 2023

(65) Prior Publication Data

US 2024/0313720 A1     Sep. 19, 2024

(30) Foreign Application Priority Data

Mar. 15, 2023     (JP) ................................. 2023-041258

(51) Int. Cl.
*H03F 3/45* (2006.01)
*H03F 1/02* (2006.01)

(52) U.S. Cl.
CPC ....... *H03F 3/45183* (2013.01); *H03F 1/0233* (2013.01); *H03F 3/45273* (2013.01); *H03F 2200/261* (2013.01)

(58) Field of Classification Search
CPC .............. H03F 3/45183; H03F 1/0233; H03F 3/45273; H03F 2200/261

(Continued)

(56) References Cited

U.S. PATENT DOCUMENTS 5,446,272 A * 8/1995 Barkan .............. G06K 7/10643
235/462.27
11,307,054 B2* 4/2022 David .................. G01D 5/2013
(Continued)

FOREIGN PATENT DOCUMENTS

JP      2004-150350 A      5/2004
JP      2008-141356 A      6/2008
(Continued)

OTHER PUBLICATIONS

Japanese Office Action dated May 12, 2026 in corresponding Japanese Patent Application 2023-041258 with English Translation, 14 pages.

*Primary Examiner* — Hafizur Rahman
(74) *Attorney, Agent, or Firm* — Kim & Stewart LLP

(57) ABSTRACT

A first circuit outputs first and second currents having different magnitudes. A second circuit receives the first current and first and second voltages, and outputs third and fourth currents based on the first and second voltages. A third circuit receives the second current and the first and second voltages, and outputs fifth and sixth currents based on the first and second voltages. A fourth circuit outputs an eighth current having a magnitude of the magnitude of the third current without a magnitude of a seventh current, which is a sum of the fifth and sixth currents, and a ninth current having a magnitude of the magnitude of the fourth current without the magnitude of the seventh current. A fifth circuit receives the eighth and ninth currents, outputs tenth and eleventh currents based on the eighth and ninth currents to a first end.

19 Claims, 7 Drawing Sheets

(58) Field of Classification Search
USPC ......................................................... 330/253
See application file for complete search history.

(56) References Cited

U.S. PATENT DOCUMENTS

| | | | | |
|---|---|---|---|---|
| 2008/0129383 A1 | 6/2008 | Kurihara | | |
| 2009/0231038 A1 | 9/2009 | Yuasa | | |
| 2010/0164770 A1* | 7/2010 | Wan | .................... | H03M 1/0607 |
| | | | | 330/251 |
| 2011/0018634 A1* | 1/2011 | Tran | ........................ | G11C 7/02 |
| | | | | 330/253 |
| 2011/0216258 A1 | 9/2011 | Kato | | |
| 2012/0169310 A1* | 7/2012 | Dearborn | .............. | H02M 3/157 |
| | | | | 323/271 |
| 2017/0077876 A1* | 3/2017 | Quilligan | ............ | H03F 3/45973 |
| 2019/0068148 A1 | 2/2019 | Oishi | | |
| 2019/0190472 A1* | 6/2019 | Snoeij | ................. | H03F 3/45089 |
| 2022/0238081 A1* | 7/2022 | Jung | ........................ | H03K 5/12 |

FOREIGN PATENT DOCUMENTS

| | | |
|---|---|---|
| JP | 2010-093772 A | 4/2010 |
| JP | 2019-041155 A | 3/2019 |
| JP | 2021-164055 A | 10/2021 |

* cited by examiner

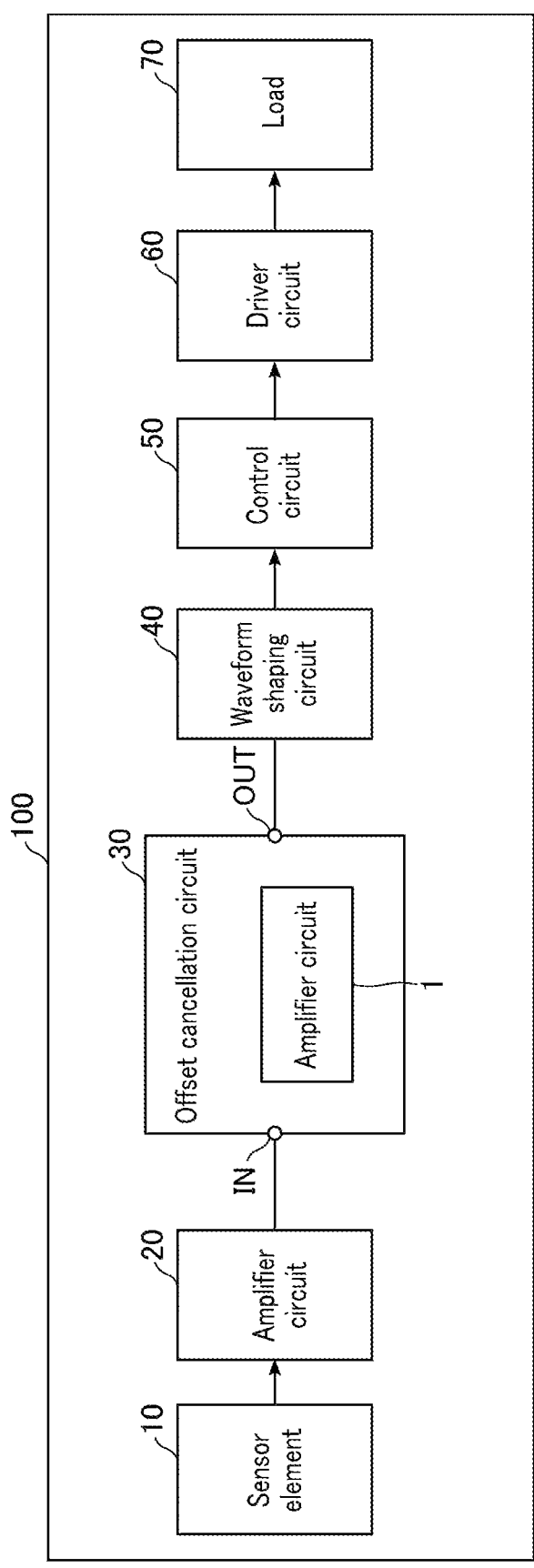
F I G. 1

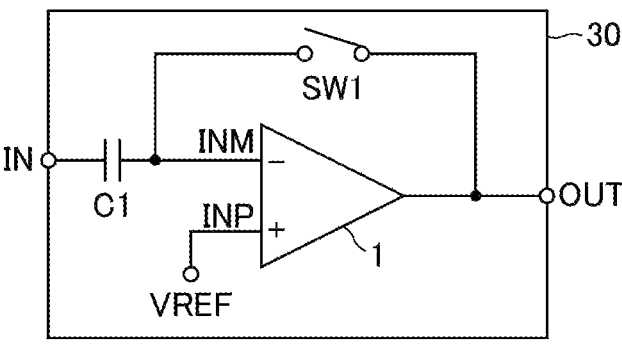
F I G. 2
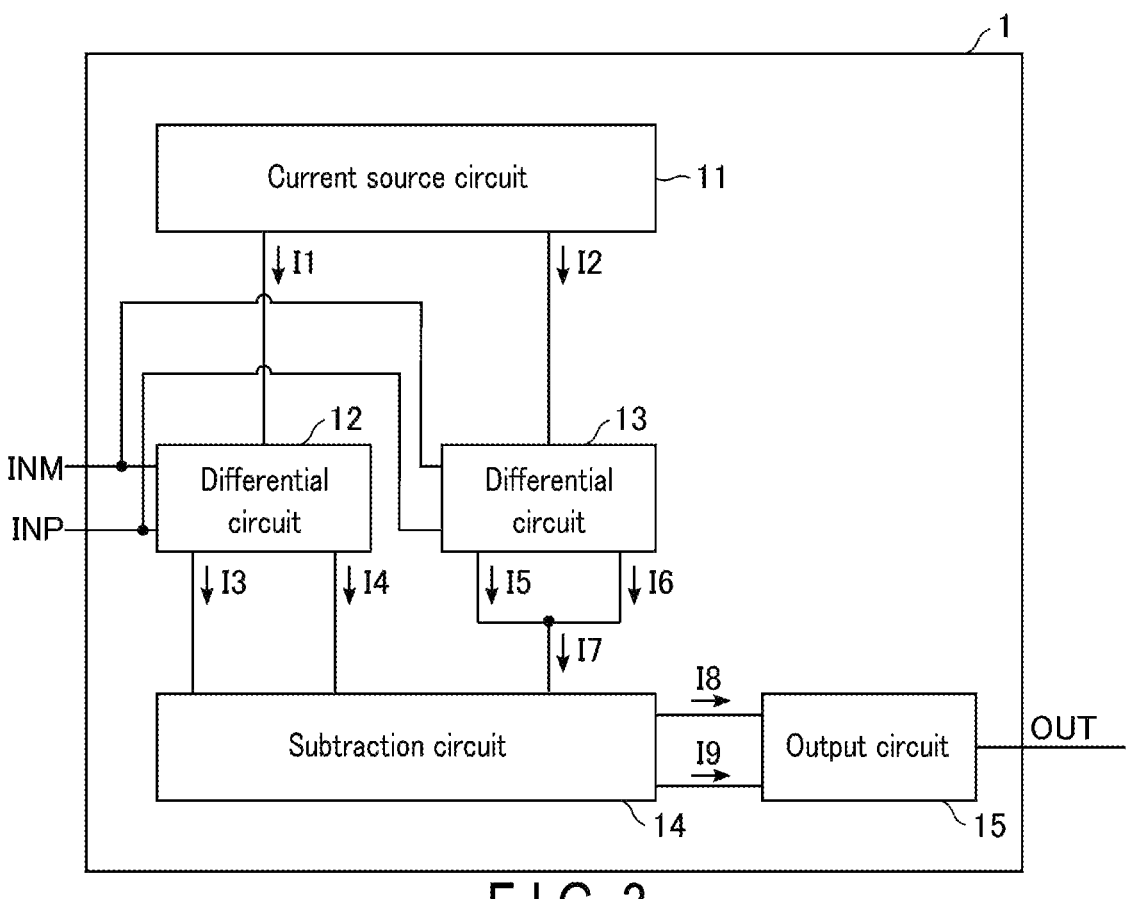
F I G. 3

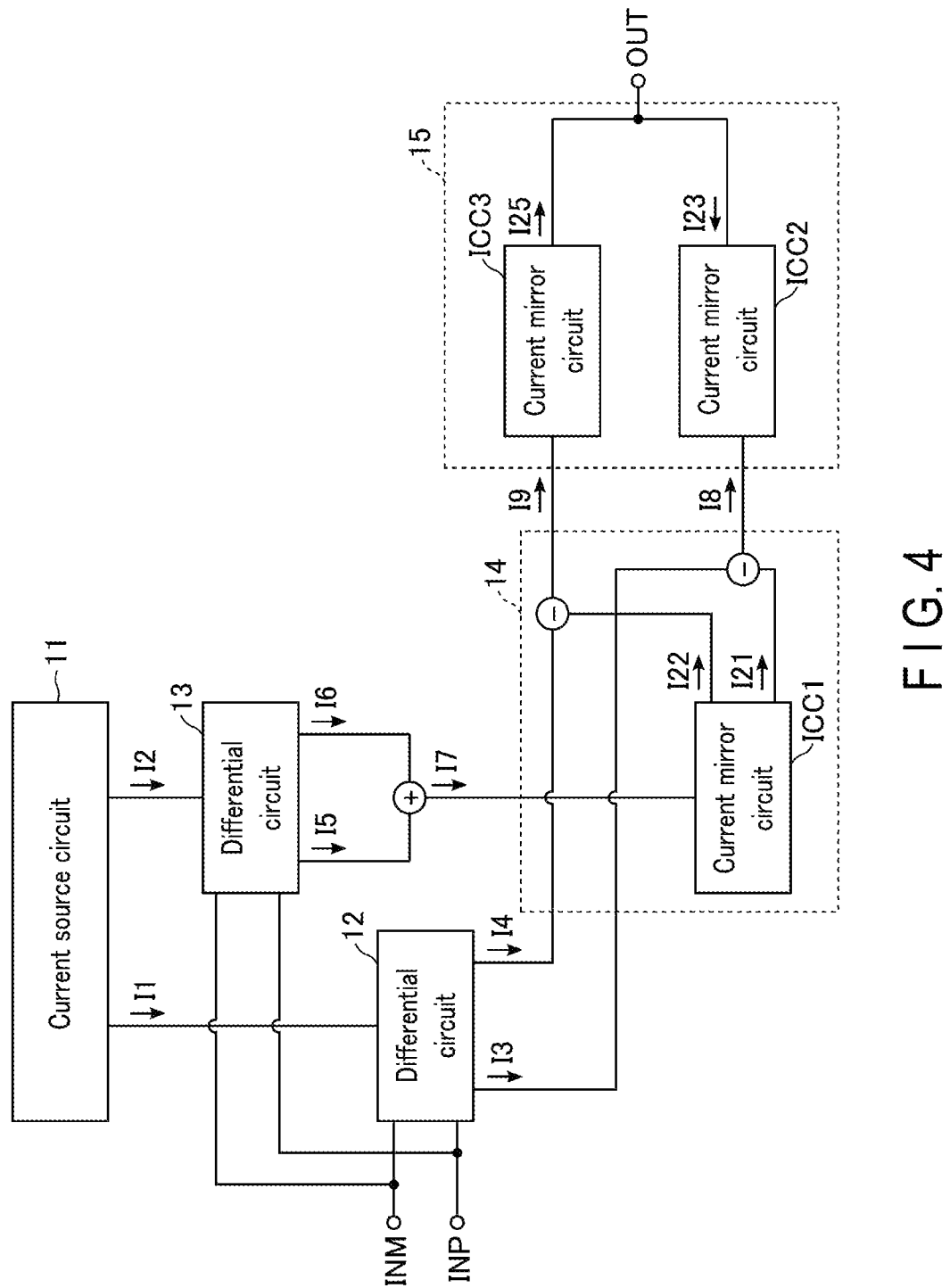
F I G. 4

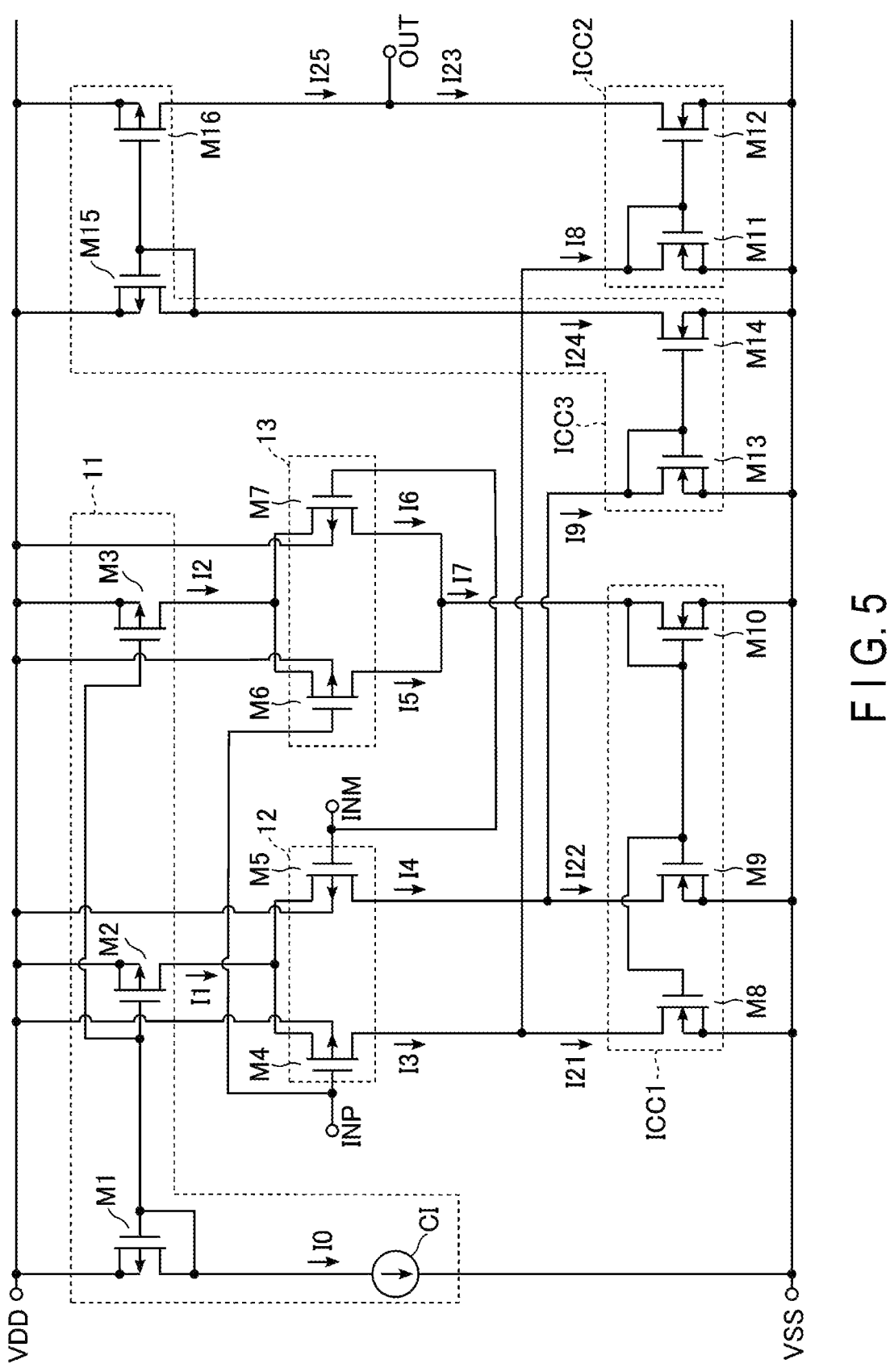
F I G. 5

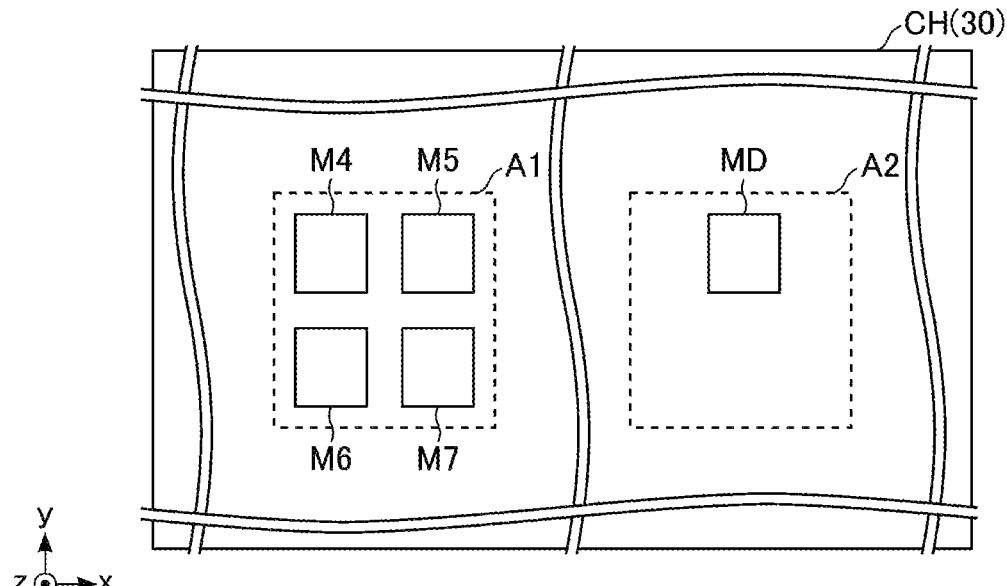
F I G. 6

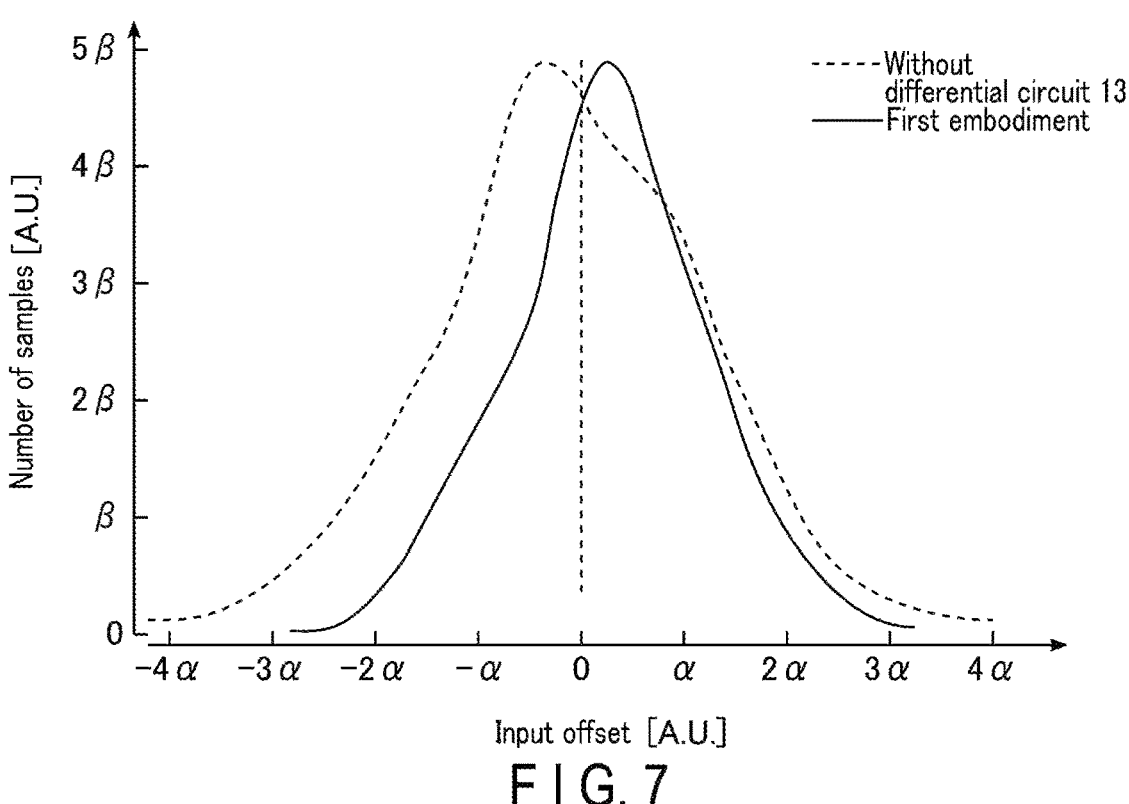
F I G. 7
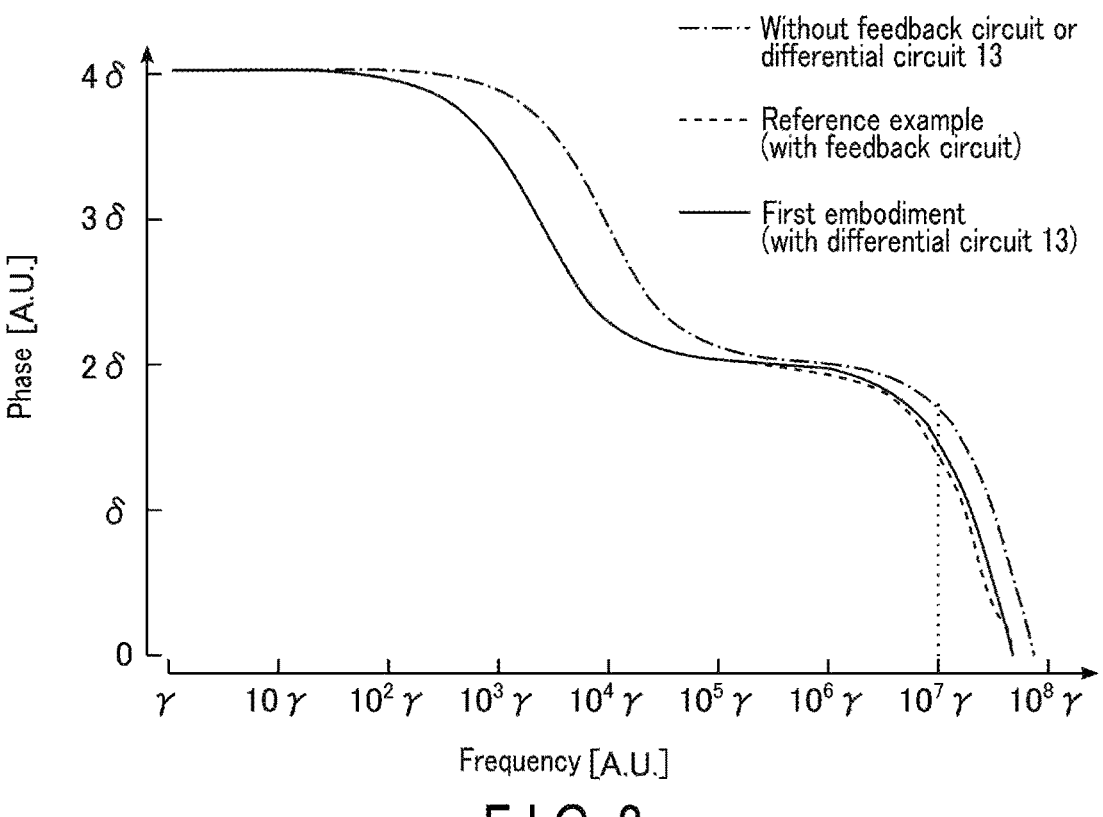
F I G. 8

AMPLIFIER CIRCUIT AND SYSTEM

CROSS-REFERENCE TO RELATED APPLICATIONS

This application is based upon and claims the benefit of priority from Japanese Patent Application No. 2023-41258, filed Mar. 15, 2023, the entire contents of which are incorporated herein by reference.

FIELD

An embodiment of the present invention relates to an amplifier circuit and a system.

BACKGROUND

An amplifier circuit used in a sensor system for amplifying small signals is required to have a small offset, have a high gain, consume only a small amount of current, operate at a high speed, and operate stably.

BRIEF DESCRIPTION OF THE DRAWINGS

FIG. 1 shows an example of a system including an amplifier circuit according to a first embodiment.

FIG. 2 shows components of an offset cancellation circuit including the amplifier circuit according to the first embodiment and how they are coupled.

FIG. 3 shows components of the amplifier circuit according to the first embodiment and how they are coupled.

FIG. 4 shows a more detailed example of the components of the amplifier circuit according to the first embodiment and how they are coupled.

FIG. 5 shows a further detailed example of the components of the amplifier circuit according to the first embodiment and how they are coupled.

FIG. 6 schematically shows an example of an arrangement of some components of the amplifier circuit according to the first embodiment.

FIG. 7 shows a distribution of an input offset by the amplifier circuit according to the first embodiment.

FIG. 8 shows a Bode plot of the closed loop of the amplifier circuit according to the first embodiment.

DETAILED DESCRIPTION

Figure 9:
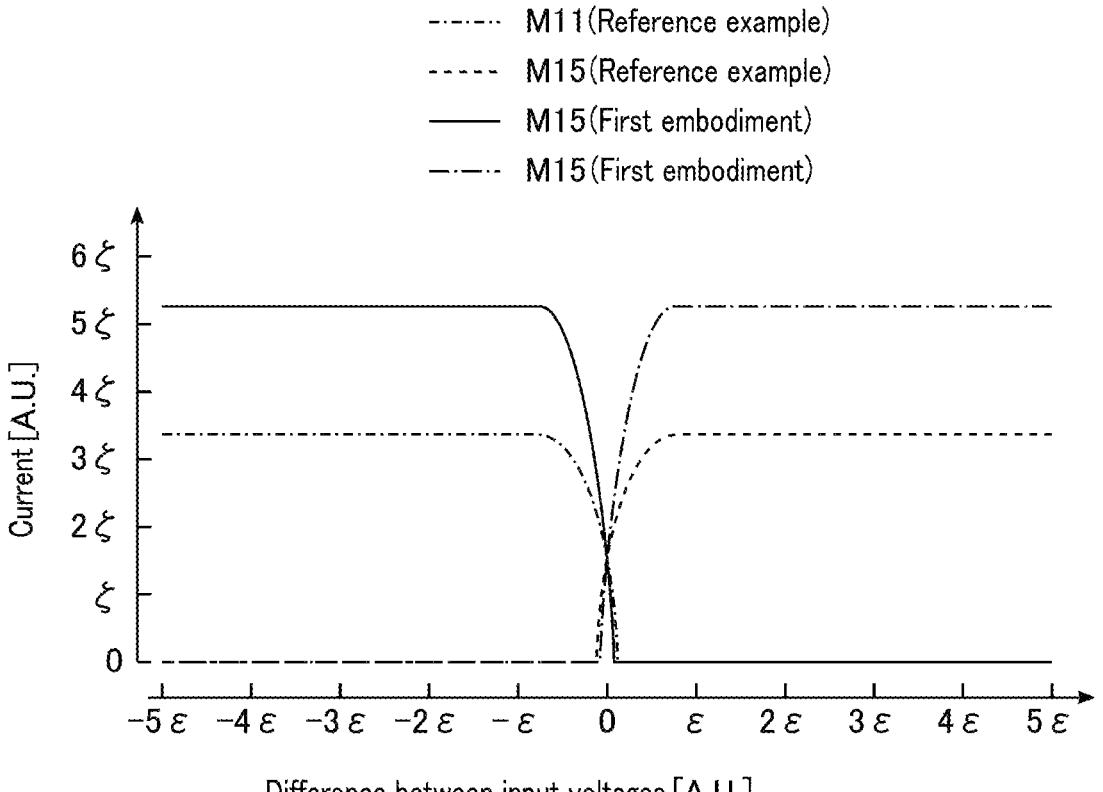
FIG. 9 shows a relationship between an input voltage difference and an output current at the amplifier circuit according to the first embodiment.

In general, an amplifier circuit according to one embodiment includes a first circuit, a second circuit, a third circuit, a fourth circuit, and a fifth circuit. The first circuit is configured to output a first current and a second current. The second current has a magnitude difference from a magnitude of the first current. The second circuit is configured to receive the first current, to receive a first voltage and a second voltage, and to output a third current and a fourth current. The third current has a magnitude that is based on the first voltage and the second voltage. The fourth current has a magnitude that is based on the first voltage and the second voltage. The third circuit is configured to receive the second current, to receive the first voltage and the second voltage, and to output a fifth current and a sixth current. The fifth current has a magnitude that is based on the first voltage and the second voltage. The sixth current has a magnitude that is based on the first voltage and the second voltage. The fourth circuit is configured to output an eighth current and a ninth current. The eighth current has a magnitude obtained by subtracting a magnitude of a seventh current from the magnitude of the third current. The seventh current is a sum of the fifth current and the sixth current. The ninth current has a magnitude obtained by subtracting the magnitude of the seventh current from the magnitude of the fourth current. The fifth circuit is configured to receive the eighth current and the ninth current, to output a tenth current to a first end, and to output an eleventh current to the first end. The tenth current is based on the eighth current. The eleventh current is based on the ninth current.

Embodiments will now be described with reference to the figures. In order to distinguish components having substantially the same function and configuration in an embodiment or over different embodiments from each other, an additional numeral or letter may be added to the end of each reference numeral or letter.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment

FIG. 1 shows an example of a system including an amplifier circuit according to a first embodiment. As shown in FIG. 1, in an example, a system 100 includes a sensor element 10, an amplifier circuit 20, an offset cancellation circuit 30, a waveform shaping circuit 40, a control circuit 50, a driver circuit 60, and a load 70.

The sensor element 10 outputs a signal in a format generated based on the type of the sensor. Examples of the sensor element 10 include a Hall element. A Hall element is a sensor element applying the Hall effect. A signal from the sensor element includes an error, such as an offset, as well as the signal itself.

The amplifier circuit 20 receives the signal output from the sensor element 10, amplifies the received signal, and outputs a signal obtained by the amplification.

The offset cancellation circuit 30 receives the signal output from the amplifier circuit 20, and outputs a signal obtained by removing an offset voltage from the received signal. The offset cancellation circuit 30 receives, at an input end IN, the signal from the amplifier circuit 20. The offset cancellation circuit 30 outputs, at an output end OUT, the signal obtained by removing the offset voltage. The offset cancellation circuit 30 includes an amplifier circuit 1 according to the first embodiment.

The waveform shaping circuit 40 receives the signal output from the offset cancellation circuit 30, and outputs the received signal as an analog or digital signal. If the sensor element 10 is a Hall element, the sensor element 10, the amplifier circuit 20, the offset cancellation circuit 30, and the waveform shaping circuit 40 may be configured as a Hall integrated circuit (IC).

The control circuit 50 outputs a control signal based on the digital signal output from the waveform shaping circuit 40.

The driver circuit 60 drives the load 70 based on the control signal output from the control circuit 50. Examples of the control circuit 50 and the driver circuit 60 include a motor control driver (MCD). In this example, the load 70 is a motor, and the system 100 is a motor system 100.

FIG. 2 shows components of the offset cancellation circuit 30 including the amplifier circuit according to the first embodiment and how they are coupled. As shown in FIG. 2, the offset cancellation circuit 30 includes an amplifier circuit 1, a capacitor C1, and a switch SW1. One electrode of the capacitor C1 functions as an input end IN.

An input end INM of the amplifier circuit 1 is coupled to the other electrode of the capacitor C1, and one end of the switch SW1. An input end INP of the amplifier circuit 1 receives a reference voltage VREF. An output end of the amplifier circuit 1 functions as an output end OUT, and is coupled to the other end of the switch SW1.

The amplifier circuit 1 functions as a buffer while the switch SW1 is on. The amplifier circuit 1 functions as a comparator while the switch SW1 is off. Hereinafter, a state of the amplifier circuit 1 functioning as a buffer may be referred to as a "buffer mode". Also, a state of the amplifier circuit 1 functioning as a comparator may be referred to as a "comparator mode". The buffer mode is used prior to the comparator mode. Due to unavoidable manufacturing variation from the intended values relating to the properties of components (e.g., transistors) of the amplifier circuit 1, an offset voltage occurs at the input end INM relative to the reference voltage VREF received at the input end INP. First, through an operation of the amplifier circuit 1 in the buffer mode, a charge of a magnitude that is based on a potential difference between the input end IN and the input end INN (i.e., reference voltage VREF+offset voltage) is injected into the capacitor C1. Subsequently, through an operation of the amplifier circuit 1 in the comparator mode, only a signal differential value is transmitted to the input end INM, and therefore an amplification signal obtained by equivalently canceling the offset voltage is output to the output end OUT.

FIG. 3 shows components of the amplifier circuit 1 according to the first embodiment and how they are coupled. As shown in FIG. 3, the amplifier circuit 1 includes a current source circuit 11, differential circuits 12 and 13, a subtraction circuit 14, and an output circuit 15.

The current source circuit 11 supplies currents I1 and I2. The current source circuit 11 controls the currents I1 and I2 to have constant magnitudes. The magnitude of the current I1 is based on a gain of a magnitude that the amplifier circuit 1 is required to have. The magnitude of the current I2 is based on an idle current of a magnitude that the output circuit 15 is required to let flow. In an example, the current I2 has a magnitude obtained by subtracting, from the current I1, the idle current of the magnitude that the output circuit 15 is required to let flow. The idle current is a current flowing in the output circuit 15 while the voltage of the input end INM is substantially equal to the voltage of the input end INP, and during this time, a current does not flow to the output end OUT. As used herein and in the claims, two elements being "substantially the same" refer to two elements that are intended to be identical but are not completely identical, due to limitations in manufacturing and/or measuring technology. The current I2 has a smaller magnitude than the current I1. In an example, the current I1 has a magnitude eight times the magnitude of the current I2. A description to be given below is based on this example.

The differential circuit I2 outputs currents I3 and I4 of a magnitude that is based on the input voltages VINM and VINP. The input voltage VINM is a voltage of the input end INM, and the input voltage VINP is a voltage of the input end INP. The differential circuit I2 receives a current I1 as a current source. The current I3 is based on the current I1, transconductance of the differential circuit 12, and a difference between the input voltage VINM and the input voltage VINP. The current I4 is based on the current I1, the transconductance of the differential circuit 12, and the difference between the input voltage VINM and the input voltage VINP. From the viewpoint of outputting currents I3 and I4 of a magnitude that is based on the input voltages VINM and VINP, the differential circuit 12 may be regarded as a voltage-to-current converter.

The differential circuit 13 outputs currents I5 and I6 of a magnitude that is based on the input voltages VINM and VINP. The differential circuit 13 receives a current I2 as a current source. The current I5 is based on the current I2, transconductance of the differential circuit 13, and the difference between the input voltage VINM and the input voltage VINP. The current I6 is based on the current I2, the transconductance of the differential circuit 13, and the difference between the input voltage VINM and the input voltage VINP. The differential circuit 13, which is a copy of the differential circuit 12, is arranged close to the differential circuit 12 on the semiconductor chip to be generated under the same manufacturing conditions, and is operated in the same environment (e.g., at the same temperature) to have substantially the same properties. That is, if the differential circuits 12 and 13 have the same dimensions (or, size) and receive currents of the same magnitude as the current source, an input voltage VINM of the same magnitude, and an input voltage VINP of the same magnitude, the differential circuits 12 and 13 respectively output the currents I3 and I5 of substantially the same magnitude. Also, if the differential circuits 12 and 13 have the same dimensions (or, size) and receive currents of the same magnitude as the current source, receive an input voltage VINM of the same magnitude, and receive an input voltage VINP of the same magnitude, the differential circuits 12 and 13 output the currents I4 and I6 of substantially the same magnitude.

The subtraction circuit 14 outputs a current of a magnitude based on a difference between two of a plurality of currents received by the subtraction circuit 14. Specifically, the subtraction circuit 14 receives currents I3, I4, and I7. The current I7 is a sum of the currents I5 and I6. The subtraction circuit 14 outputs a current I8 of a magnitude based on a difference between the magnitude of the current I3 and the magnitude of the current I7, namely, a current I8 of a magnitude obtained by subtracting the magnitude of the current I7 from the magnitude of the current I3. The subtraction circuit 14 outputs a current I9 of a magnitude based on a difference between the magnitude of the current I4 and the magnitude of the current I7, namely, a current I9 of a magnitude obtained by subtracting the magnitude of the current I7 from the magnitude of the current I4.

The output circuit 15 outputs, at the output end OUT, a current of a magnitude based on a difference between the current I8 and the current I9. Since the currents I3 and I4 are equal while the voltage of the input end INM is substantially equal to the voltage of the input end INP, the current I8 is equal to the current I9. Since there is no difference in magnitude between the current I8 and the current I9, a current does not flow to the output end OUT.

FIG. 4 shows a more detailed example of the components of the amplifier circuit 1 according to the first embodiment and how they are coupled. As shown in FIG. 4, the subtraction circuit 14 includes a current mirror circuit ICC1, and the output circuit 15 includes current mirror circuits ICC2 and ICC3. The number of the current mirror circuits is not limited to two, and may be set to any number.

The current mirror circuit ICC1 outputs a current I21 of a magnitude that is based on the magnitude of the current I7, and a current I22 of a magnitude substantially the same as the magnitude of the current I21. That is, the current I22 has a magnitude equal to the magnitude of the current I21.

The current I8 has a magnitude obtained by subtracting the magnitude of the current I21 from the magnitude of the current I3. The current I9 has a magnitude obtained by subtracting the magnitude of the current I22 from the magnitude of the current I4.

The current mirror circuit ICC2 outputs a current that is a copy of the current I8, namely, a current I23 of a magnitude that is based on the magnitude of the current I8 with the opposite direction. The output of the current mirror circuit ICC2 is coupled to the output end OUT.

The current mirror circuit ICC3 outputs a current that is a copy of the current I9, namely, a current I25 of a magnitude that is based on the magnitude of the current I9. The output of the current mirror circuit ICC3 is coupled to the output end OUT.

FIG. 5 shows a more detailed example of the components of the amplifier circuit 1 according to the first embodiment and how they are coupled. As shown in FIG. 5, the amplifier circuit 1 includes a constant current circuit CI, and metal-oxide-semiconductor field-effect transistors (MOSFETs) M1 to M16. The transistors M1, M2, M3, M4, M5, M6, M7, M15, and M16 are p-type transistors. The transistors M8, M9, M10, M11, M12, M13, and M14 are n-type transistors. A source/drain of each transistor may be simply referred to as an "end".

The transistors M1, M2, and M3, and the constant current circuit CI are included in the current source circuit 11. The transistors M1, M2, and M3 configure a current mirror.

The transistor M1 is coupled, at its source, to a node that receives a power-supply voltage VDD. The transistor M1 is coupled, at its drain, to a gate of the transistor M1, namely, the transistor M1 is diode-coupled.

The constant current circuit CI is coupled to the drain of the transistor M1. Through the constant current circuit CI, a current I0 flows through the drain of the transistor M1.

The transistor M2 is coupled, at its source, to the node of the power-supply voltage VDD. The transistor M2 is coupled, at its gate, to the gate of the transistor M1. In response to the magnitudes of source and gate voltages with the same magnitudes as the source and gate voltages of the transistor M1, the transistor M2 lets a drain current of a magnitude that is based on aspect ratios of the transistors M1 and M2 flow. An aspect ratio of a MOSFET refers to a ratio of a gate width to a gate length. In an example of a current mirror implemented with a certain first transistor and a certain second transistor to allow the first transistor to conduct a larger drain current than the second transistor, the first and second transistors are formed in the same manufacturing process, and the first transistor has dimensions (or, a size) greater than those of the second transistor. As an example, the first transistor has a gate width greater than a gate width of the second transistor, and/or a gate length smaller than a gate length of the second transistor. As an example, in order to allow the first transistor to have a drain current of a magnitude n times (where n is a positive number) the magnitude of the drain current of the second transistor, the first transistor has a gate width n times the gate width of the second transistor. A drain current (and thus dimensions) of the transistor M2 has a magnitude determined based on target magnitudes of the currents I0 and I1. A current I1 flows through a drain of the transistor M2.

The transistor M3 is coupled, at its source, to the node of the power-supply voltage VDD. The transistor M3 is coupled, at its gate, to the respective gates of the transistors M1 and M2. A current I2 flows through a drain of the transistor M3. As described above with reference to FIG. 3, the current I2 has a smaller magnitude than the current I1. The drain current of the transistor M3 has a magnitude determined based on target magnitudes of the currents I0 and I2.

The transistors M4 and M5 are included in the differential circuit 12. The and M5 have substantially the same transconductance. In an example of a certain first transistor and a certain second transistor implemented to have substantially the same transconductance, the first and second transistors are formed in the same manufacturing process, and have substantially the same dimensions (or, size). As an example, the first and second transistor have substantially the same gate width, and have substantially the same gate length.

The transistor M4 receives, at its source, a part of the current I1, and is coupled to the drain of the transistor M2. The transistor M4 receives, at its gate, an input voltage VINP. A current I3 flows through a drain of the transistor M4.

The transistor M5 receives, at its source, a current obtained by subtracting the current of the transistor M4 from the current I1, and is coupled to the drain of the transistor M2. The transistor M5 receives, at its gate, an input voltage VINM. A current I4 flows through a drain of the transistor M5. While the magnitude of the input voltage VINM is substantially equal to the magnitude of the input voltage VINP, a current of a magnitude ½ times the magnitude of the current I1 flows through each of the transistors M4 and M5.

The transistors M6 and M7 are included in the differential circuit 13. The transistors M6 and M7 have substantially the same transconductance. A current density of the transistors M6 and M7 (or, an aspect ratio of the transistors M6 and M7 to the current I2) is substantially the same as a current density of the transistors M4 and M5 (or, an aspect ratio of the transistors M4 and M5 to the current I1). On a semiconductor chip, transistors having the same properties are arranged in proximity to one another to be subjected to the same mechanical and thermal stress. Accordingly, as shown in FIG. 6, the transistors M4, M5, M6, and M7 are arranged in proximity to one another on a semiconductor chip. The transistors M4, M5, M6, and M7 are provided in a region A1, and are arranged close to one another. That is, a transistor having distinct properties from those of the transistors M4, M5, M6, and M7, such as a transistor MD, is not arranged therebetween. The arrangement of the transistors M4, M5, M6, and M7 shown in FIG. 6 is merely an example, and is not limited thereto. The region A1 is distinct from a region A2 including the transistor MD having properties different from those of the transistors M4, M5, M6, and M7.

As shown in FIG. 5, the transistor M6 receives, at its source, a part of the current I2, and is coupled to the drain of the transistor M3. The transistor M6 receives, at its gate, the input voltage VINP. A current I5 flows through a drain of the transistor M6.

The transistor M7 receives, at its source, a current obtained by subtracting the current of the transistor M6 from the current I2, and is coupled to the drain of the transistor M3. The transistor M7 receives, at its gate, an input voltage VINM. A current I6 flows through a drain of the transistor M7. While the magnitude of the input voltage VINM is substantially equal to the magnitude of the input voltage VINP, a current of a magnitude ½ times the magnitude of the current I2 flows through each of the transistors M6 and M7. A drain of the transistor M7 is coupled to the drain of the transistor M6. A current I7 flows through a node at which the drain of the transistor M7 and the drain of the transistor M6 are coupled.

The transistors M8, M9, and M10 are included in the current mirror circuit ICC1. The transistor M8 is coupled, at its drain, to the drain of the transistor M4. The transistor M8 is coupled, at its source, to the node of a ground voltage VSS. A current I21 flows through a drain of the transistor M8. A current I8 is obtained by subtracting the current I21 from the current I3. The current I8 determines the magnitude of the idle current. Therefore, the drain current of the transistor M8 has a magnitude that allows the current I21 to have a desired magnitude determined based on the magnitudes of the currents I3 and I8. Based on an example in which the current I1 has a magnitude eight times the magnitudes of the currents I0 and I2, the transistor M8 outputs a drain current of a magnitude three times the drain current of the transistor M10. Since a drain current of a magnitude ½ times the magnitude of the current I1 is output as the current I3 while the voltage of the input end INM is substantially equal to the voltage of the input end INP, the current I8 obtained by subtracting the current I21 and the idle current is equal to I0.

The transistor M9 is coupled, at its drain, to the drain of the transistor M5. The transistor M9 is coupled, at its source, to a node of a ground voltage VSS. The transistor M9 is, at its gate, coupled to the gate of the transistor M8. A current I22 flows through the drain of the transistor M9. A current I9 is obtained by subtracting the current I22 from the current I4. The transistor M9 has a drain current of substantially the same magnitude as the drain current of the transistor M8.

The transistor M10 receives, at its drain, the current I7, and is coupled to the respective drains of the transistors M6 and M7. The transistor M10 is coupled, at its source, to the node of the ground voltage VSS. The transistor M10 is coupled, at its gate, to the gate of the transistor M9 and the drain of the transistor M10.

The transistors M11 and M12 are included in the current mirror circuit ICC2. The transistor M11 is coupled, at its drain, to the respective drains of the transistors M4 and M8. The transistor M11 is coupled, at its source, to the node of the ground voltage VSS. The transistor M11 is coupled, at its gate, to the drain of the transistor M11.

The transistor M12 is coupled, at its drain, to an output end OUT. The transistor M12 is coupled, at its source, to the node of a ground voltage VSS. The transistor M12 is, at its gate, coupled to the gate of the transistor M11. A current I23 flows through the drain of the transistor M12. The current I23 configures a part of the output current (including the idle current) of the amplifier circuit 1. The transistor M12 has a drain current of substantially the same magnitude as the drain current of the transistor M11. Therefore, the current I23 has substantially the same magnitude as the magnitude of the current I8.

The transistors M13 and M14 are included in the current mirror circuit ICC3. The transistor M13 is coupled, at its drain, to the respective drains of the transistors M5 and M9. The transistor M13 is coupled, at its source, to the node of the ground voltage VSS. The transistor M13 is coupled, at its gate, to the drain of the transistor M13.

The transistor M14 is coupled, at its source, to the node of the ground voltage VSS. The transistor M14 is, at its gate, coupled to the gate of the transistor M13. A current I24 flows through a drain of the transistor M14. The transistor M14 has a drain current of substantially the same magnitude as the drain current of the transistor M13. Therefore, the current I24 has substantially the same magnitude as the magnitude of the current I9.

The transistors M15 and M16 are included in the current mirror circuit ICC3. The transistor M15 is coupled, at its source, to the node of the power-supply voltage VDD. The transistor M15 is coupled, at its drain, to the drain of the transistor M14. The transistor M15 is coupled, at its gate, to the drain of the transistor M15.

The transistor M16 is coupled, at its source, to the node of the power-supply voltage VDD. The transistor M16 is, at its gate, coupled to the gate of the transistor M15. The transistor M16 is coupled, at its drain, to the output end OUT. A current I25 flows through the drain of the transistor M16. The current I25 configures the remaining part of the output current (including the idle current) of the amplifier circuit 1, namely, the set of the currents I23 and I25 configures the output current (including the idle current). The transistor M16 has a drain current of substantially the same magnitude as the drain current of the transistor M15. Therefore, the current I25 has substantially the same magnitude as the magnitude of the current I24.

According to the first embodiment, it is possible to provide an amplifier circuit capable of operating at a high speed with high stability, as will be described below.

For comparison, a reference amplifier circuit will be described below. For improvement in the precision of the operation of the amplifier circuit 1, a differential voltage (an input offset) between the input end INM and the input end INP that suppresses the output current of the output end OUT of the amplifier circuit 1 small is preferably small and varies only a little. As a technique of suppressing an input offset, the idle current is controlled to be small, or limited. The reference amplifier circuit controls the idle current by a feedback based on the idle current. That is, the reference amplifier circuit does not include the differential circuit 13 according to the first embodiment, and instead includes an idle current detection circuit and a feedback circuit. The idle current detection circuit detects a current of a transistor coupled to an output end OUT. The feedback circuit supplies a current that is based on the detected idle current to a subtraction circuit 14. The subtraction circuit 14 subtracts the current that is based on the idle current from the current from the differential circuit 12. The current from the subtraction circuit 14 is supplied to the output circuit 15, thereby forming an idle loop, and an idle current flowing through the output circuit 15 is adjusted.

The feedback circuit causes a delay in the phase of the output relative to the high-frequency input in the buffer mode by means of the resistance and capacitance of the feedback circuit (including the transistor parasitic resistance and capacitance). The delay in the phase lowers a phase margin of the reference amplifier circuit in the buffer mode.

Also, the feedback circuit functions to limit the idle current, namely, a current flowing to the output end OUT. Accordingly, during amplification of the input to the amplifier circuit 1 (i.e., voltage of the input end INM) in the comparator mode, the function of the feedback circuit suppresses an output current flowing through the output end OUT. If the output current is low, a slew rate of the amplifier circuit is low, namely, the operation speed of the amplifier circuit is low. In general, the slew rate can be increased by increasing the idle current. However, since there is a tradeoff between the idle current and the input offset, and the idle current keeps flowing even if the amplifier circuit is not amplifying a signal, an increase in the idle current leads to an increase in the consumption current of the amplifier circuit.

The amplifier circuit 1 according to the first embodiment controls the idle current of the output circuit 15 using a difference between the output of the differential circuit 12, which receives an input signal, and an output of the differential circuit 13, which is a copy of the differential circuit 12 and receives an input signal. That is, the amplifier circuit 1 controls the idle current by feedforward. The differential circuit 13 generates a current that is based on the magnitudes of the voltages at the input ends INM and INP using, as the current source, a current I2 of substantially the same magnitude as the difference between the current I1 and an idle current of a desired magnitude. Based on this current, the output current of the differential circuit 12 is adjusted, and the idle current of the output circuit 15 is controlled by the adjusted output current of the differential circuit 12. That is, the current I2 (or a current proportional to the current I2) is subtracted from the current of the output of the differential circuit 12 to generate a subtracted current with a magnitude that is based on an idle current of a desired magnitude and the output circuit 15 is controlled by the subtracted current, and thereby the idle current of the desired magnitude flows through the output circuit 15. With such configuration, too, it is possible to control the idle current, and eventually to control the input offset, as shown in FIG. 7.

FIG. 7 shows, in given units, input offsets during use in the buffer mode in cases where the differential circuit 13 according to the first embodiment is provided and not provided under certain conditions. In FIG. 7, both a vertical axis and a horizontal axis are shown on a linear scale. If the differential circuit 13 is not provided, the standard deviation is 1.17 α. On the other hand, if the differential circuit 13 is provided, the standard deviation is 0.91 α, meaning that the input offset has been improved. Such suppression of the input offset can be realized while realizing a desired gain by using both of the currents I1 and I2.

Also, the amplifier circuit 1 controls the idle current by feedforward through the differential circuit 13, and thus does not include a feedback circuit coupled to the output circuit 15. Accordingly, the resistance and capacitance applied to the output circuit 15 (including the transistor parasitic resistance and capacitance) is smaller than the resistance and capacitance applied to the output circuit 15 in the reference amplifier circuit. Thereby, a delay in phase of the output at the amplifier circuit 1 is smaller than a delay in phase of the output at the reference amplifier circuit. Accordingly, as shown in FIG. 8, the amplifier circuit 1 has a phase margin higher than that of the reference amplifier circuit.

FIG. 8 shows a part of a Bode plot expressing a relationship between the frequency and the phase in given units, with respect to an amplifier circuit 1 including neither a feedback circuit nor a differential circuit 13, a reference amplifier circuit, and the amplifier circuit 1 according to the first embodiment in the buffer mode. In FIG. 8, a vertical axis is shown on a linear scale, and a horizontal axis is shown on a logarithmic scale. In either of the three types of the amplifier circuits, the loop gain is 0 dB at the frequency of approximately $10^7\gamma$ denoted by the dotted line. The provision of the feedback circuit or the differential circuit 13 to limit the idle current causes deterioration in phase properties. On the other hand, the phase properties of the amplifier circuit 1 according to the first embodiment at the frequency at which the loop gain is 0 dB are closer to the phase properties of the amplifier circuit including neither a feedback circuit nor a differential circuit 13 than the phase properties of the reference amplifier circuit. That is, the phase margin in the first embodiment is higher than that of the reference amplifier circuit. Accordingly, the amplifier circuit 1 has a higher stability than the stability of the reference amplifier circuit (more robust against abnormal oscillation).

Also, according to the first embodiment, in the amplifier circuit 1, which does not include a feedback circuit included in a reference amplifier circuit, excessive suppression of an output current by the function of the feedback circuit does not occur. Accordingly, as shown in FIG. 9, the output current of the amplifier circuit 1 is greater than the output current of the reference amplifier circuit. FIG. 9 shows, in given units, a relationship between a difference between the input voltages in the comparator mode and an output current with respect to the amplifier circuit 1 and the reference amplifier circuit. In FIG. 9, both a vertical axis and a horizontal axis are shown on a linear scale. 9 currents FIG. shows flowing through the transistors M11 and M15 provided in place of the transistors M12 and M16. If the transistors M11 and M12 have the same dimensions, the drain current of the transistor M12 is substantially the same as the drain current of the transistor M11, and if the transistors M15 and M16 have the same dimensions, the drain current of the transistor M15 is substantially the same as the drain current of the transistor M16. Accordingly, FIG. 9 shows currents of the transistors M12 and M16, and the difference between currents is substantially the same as the output current (i.e., the current flowing through M12 and M16 in the case of the difference between the input voltages being zero is the idle current, and the output current does not flow because of the zero difference between currents).

As shown in FIG. 9, the maximum current of the transistors M11 and M15 at the amplifier circuit 1 is larger than the maximum current of the transistors M11 and M15 at the reference amplifier circuit. Based thereon, the slew rate at the amplifier circuit 1 is higher than the slew rate at the reference amplifier circuit. That is, the amplifier circuit 1 can be operated at a higher speed than the reference amplifier circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier circuit comprising:
   a first circuit configured to output a first current and a second current, the second current having a magnitude difference from a magnitude of the first current;
   a second circuit configured to receive the first current, to receive a first voltage and a second voltage, and to output a third current and a fourth current, the third current having a magnitude that is based on the first voltage and the second voltage, the fourth current having a magnitude that is based on the first voltage and the second voltage;
   a third circuit configured to receive the second current, to receive the first voltage and the second voltage, and to output a fifth current and a sixth current, the fifth current having a magnitude that is based on the first voltage and the second voltage, the sixth current having a magnitude that is based on the first voltage and the second voltage;
   a fourth circuit configured to output an eighth current and a ninth current, the eighth current having a magnitude obtained by subtracting a magnitude of a seventh current from the magnitude of the third current, the seventh current being a sum of the fifth current and the sixth current, the ninth current having a magnitude obtained by subtracting the magnitude of the seventh current from the magnitude of the fourth current; and a fifth circuit configured to receive the eighth current and the ninth current, to output a tenth current to a first end, and to output an eleventh current to the first end, the tenth current being based on the eighth current, the eleventh current being based on the ninth current.

2. The amplifier circuit according to claim 1, wherein the second circuit includes:

a first transistor including a second end that receives the first current, a third end that outputs the third current, and a first gate that receives the first voltage; and a second transistor including a fourth end that receives the first current, a fifth end that outputs the fourth current, and a second gate that receives the second voltage, wherein the third circuit includes:

a third transistor including a sixth end that receives the second current, a seventh end that outputs the fifth current, and a third gate that receives the first voltage; and a fourth transistor including seventh end that receives the second current, an eighth end that outputs the sixth current, and a fourth gate that receives the second voltage.

3. The amplifier circuit according to claim 2, wherein the first transistor and the second transistor have a substantially identical size, and the third transistor and the fourth transistor have a substantially identical size.

4. The amplifier circuit according to claim 2, wherein the first transistor, the second transistor, the third transistor, and the fourth transistor have a substantially identical current density.

5. The amplifier circuit according to claim 2, wherein the first transistor, the second transistor, the third transistor, and the fourth transistor are arranged in proximity to one another.

6. The amplifier circuit according to claim 2, wherein the fourth circuit includes a first current mirror circuit configured to receive the seventh current and to output a tenth current and an eleventh current, the third current is a sum of the eighth current and the tenth current, the fourth current is a sum of the ninth current and the eleventh current, the fifth circuit includes:

a second current mirror circuit configured to receive the eighth current and to output the tenth current; and a third current mirror circuit configured to receive the ninth current and to output a twelfth current, and the first circuit includes a fifth current mirror circuit configured to receive a thirteenth current and to output the first current and the second current.

7. The amplifier circuit according to claim 1, wherein the fourth circuit includes a first current mirror circuit configured to receive the seventh current and to output a tenth current and an eleventh current, the third current is a sum of the eighth current and the tenth current, and the fourth current is a sum of the ninth current and the eleventh current.

8. The amplifier circuit according to claim 7, wherein the first current mirror circuit includes a fifth transistor, a sixth transistor, and a seventh transistor, the fifth transistor includes a ninth end and a fifth gate, the ninth end being coupled to a third end that outputs the first current, the sixth transistor includes a tenth end and a sixth gate, the tenth end being coupled to a fifth end that outputs the second current, the seventh transistor includes an eleventh end and a seventh gate, the eleventh end being coupled to a first node that receives the fifth current and the sixth current, and the seventh gate is coupled to the eleventh end, the fifth gate, and the sixth gate.

9. The amplifier circuit according to claim 1, wherein the fifth circuit includes:

a second current mirror circuit configured to receive the eighth current and to output the tenth current; and a third current mirror circuit configured to receive the ninth current and to output a twelfth current.

10. The amplifier circuit according to claim 9, wherein the second current mirror circuit includes an eighth transistor and a ninth transistor, the eighth transistor includes a twelfth end and a seventh gate, the twelfth end receiving the third current, the seventh gate being coupled to the twelfth end, the ninth transistor includes a thirteenth end coupled to the first end and an eighth gate coupled to the seventh gate, the third current mirror circuit includes a tenth transistor, an eleventh transistor, a twelfth transistor, and a thirteenth transistor, the tenth transistor includes a fourteenth end and a ninth gate, the fourteenth end receiving the fourth current, the ninth gate being coupled to the fourteenth end, the eleventh transistor includes a fifteenth end and a tenth gate, the tenth gate being coupled to the ninth gate, the twelfth transistor includes a sixteenth end coupled to the fifteenth end and an eleventh end coupled to the sixteenth end, and the thirteenth transistor includes a seventeenth end coupled to the first end and a twelfth gate coupled to the eleventh gate.

11. The amplifier circuit according to claim 1, wherein the first circuit includes a fifth current mirror circuit configured to receive a thirteenth current and to output the first current and the second current.

12. The amplifier circuit according to claim 11, wherein the fifth current mirror circuit includes a fourteenth transistor, a fifteenth transistor, and a sixteenth transistor, the fourteenth transistor includes an eighteenth end and a thirteenth gate, the eighteenth end receiving the thirteenth current, the thirteenth gate being coupled to the eighteenth end, the fifteenth transistor includes a nineteenth end and a fourteenth gate, the nineteenth end outputting the first current, the fourteenth gate being coupled to the thirteenth gate, and the sixteenth transistor includes a twentieth end and a fifteenth gate, the twentieth end outputting the second current, the fifteenth gate being coupled to the thirteenth gate.

13. The amplifier circuit according to claim 12, wherein the sixteenth transistor has a smaller size than a size of the fifteenth transistor.

14. The amplifier circuit according to claim 13, wherein the sixteenth transistor has either a gate width smaller than a gate width of the fifteenth transistor or a gate length greater than a gate length of the fifteenth transistor.

15. A system comprising:

a load;

the amplifier circuit according to claim 1; and a circuit configured to control the load based on an output from the amplifier circuit.

16. A system comprising:

a load;

the amplifier circuit according to claim 2; and a circuit configured to control the load based on an output from the amplifier circuit.

17. A system comprising:

a load;

the amplifier circuit according to claim 7; and a circuit configured to control the load based on an output from the amplifier circuit.

18. A system comprising:

a load;

the amplifier circuit according to claim 9; and a circuit configured to control the load based on an output from the amplifier circuit.

19. A system comprising:

a load;

the amplifier circuit according to claim 11; and a circuit configured to control the load based on an output from the amplifier circuit.

* * * * *